United States Patent [19]
Allen

[11] Patent Number: 5,970,373
[45] Date of Patent: Oct. 19, 1999

[54] METHOD FOR PREVENTING OXIDATION IN THE FORMATION OF A VIA IN AN INTEGRATED CIRCUIT

[75] Inventor: Lynn R. Allen, Camas, Wash.

[73] Assignees: Sharp Laboratories of America, Inc., Camas, Wash.; Sharp Kabushiki Kaisha, Osaka, Japan

[21] Appl. No.: 08/644,190

[22] Filed: May 10, 1996

[51] Int. Cl.$^6$ .............................................. H01L 21/4763
[52] U.S. Cl. .......................................................... 438/624
[58] Field of Search ...................................... 438/624, 625, 438/629, 634, 637, 687, 672, 667

[56] References Cited

U.S. PATENT DOCUMENTS

| | | | |
|---|---|---|---|
| 5,527,739 | 6/1996 | Parillo et al. | 438/687 |
| 5,795,819 | 8/1998 | Motsiff et al. | 438/687 |
| 5,817,572 | 10/1998 | Chiang et al. | 438/624 |

OTHER PUBLICATIONS

MRS Bulletin dated Feb. 23, 1993 entitled Copper Etching: New Chemical Approaches by Mark J. Hampden–Smith, Chemical Department and Toivo T. Kodas, Chemical Engineering Department, University of New Mexico, Albuquerque, NM 87131, consisting of 20 pages of text, Table 1 and 10 pages of drawings.

*Primary Examiner*—John F. Niebling
*Assistant Examiner*—Lynne A. Gurley
*Attorney, Agent, or Firm*—Gerald Maliszewski; David C. Ripma

[57] ABSTRACT

A method is provided for preventing the formation of oxides in the process of creating a connection aperture through an insulating layer overlying a copper conductor having a connection surface region. The method deposits at least two insulation layers over the copper connection region including a nitride dielectric material adjacent the connection region, and a second insulating material adjacent the nitride layer. An area of the second insulator is selectively removed to partially form a connection aperture extending to the nitride layer. Next, an area of the nitride layer, and any layer overlying the nitride layer, is selectively removed to form an aperture in registration with the aperture formed in the second layer. The completed connection aperture extends through the entire insulating layer to the connection region. The nitride layer protects the copper from processes that cause oxidation as the layers overlying the nitride layer are removed. The present invention also provides an integrated circuit with at least two insulation layers overlying a copper connection region, with a nitride layer adjacent the connection region.

13 Claims, 7 Drawing Sheets

METHOD FOR PREVENTING OXIDATION IN THE FORMATION OF A VIA IN AN INTEGRATED CIRCUIT

BACKGROUND AND SUMMARY OF THE INVENTION

This invention relates generally to integrated circuits, and more particularly to a system and method of forming a via through dielectric material overlying a copper conductor in an integrated circuit.

Electrically conductive interconnects, used in the fabrication of integrated circuits and semiconductors, are an area of ongoing research. There is a need for interconnects and vias to have both low resistivity, and the ability to withstand volatile process environments. Aluminum and tungsten metals are often used in the production of integrated circuits for making interconnections or vias between electrically active areas. These metals are popular because they are easy to use in a production environment, unlike copper which requires special handling. Aluminum has a fairly good resistivity, approximately 2.65 $\mu\Omega$ cm. Aluminum oxides which are unintentionally formed in processing prevent good electrical connections, but are relatively easy to remove. Tungsten has a higher resistivity at approximately 6 $\mu\Omega$ cm, however, tungsten has advantages which makes its use desirable. These advantages include resistant to electromigration, or the ability maintain its electromechanical integrity, and also resistance to diffusion into surrounding materials. Further information about the relative merits of metals used in integrated circuits is found in, Mark J. Hampden-Smith and Tovia T. Kodas of University of New Mexico, "Copper Etching: New Chemical Approaches", MRS Bulletin, Feb. 23, 1993, pg. 2.

Copper has very good resistance to electromigration, approximately tens times better than aluminum. In addition, copper has extremely low resistivity at approximately 1.67 $\mu\Omega$ cm. One problem with copper is that it oxidizes easily, and the oxide is difficult to remove. Oxidized copper surfaces prevent reliable connections from being made with other conductors, and so oxidation interferes with electrical conductivity. As the complexity of integrated circuits (ICs) increases, so do the number of process steps, and the potential for unintentionally oxidizing connection surfaces. Therefore, despite copper's excellent electrical characteristics, it is infrequently used in the fabrication of integrated circuit interconnects.

The formation of multilayered, compact, integrated circuits with interconnecting vias requires anisotropic etching techniques. Anisotropic etching is directional so that the etching, or removal of material, is propagated in one direction, say the z axis, and not in the other directions, the x and y axes. Anisotropic etching allows for the formation of narrow, steep sided, wells and cylindrical vias between dielectric layers of an IC in a production environment. These vias are often used for interconnects between components at different layers of the IC.

One commercially prevalent form of anisotropic etching is the plasma etch. Plasma etching is performed in a chamber where an atmosphere of a relatively inert gas is introduced. The pressure of the gas and pump rates are controlled. A voltage across the chamber, at a predetermined frequency, is created to establish a flow of ions in a known direction. In addition, the temperature of the chamber, and the time of exposure to the ion flow, are controlled. As a consequence of the radio frequency voltage in the chamber, the relatively inert gas is transformed into a plasma consisting of ions and radicals. The ions and radicals react with the film layers on the IC wafer to form volatile etch products which perform the etching function on selected areas of the IC.

Oxygen is introduced in many plasma etch processes to help create the volatile etch product. One problem with the use of oxygen is that it promotes the oxidation of many metals. Tungsten is a popular interconnect material because it is relatively difficult to oxidize. Aluminum, although easily oxidized, is relatively easy to clean with standard solvents and etch techniques. Copper is also easily oxidized, and the oxides formed by copper are difficult to remove in an IC production environment. Therefore, even though copper's low resistivity makes it an attractive interconnect material, copper has been difficult to use in commercial integrated circuit fabrication where plasma etching, and other processes using oxygen, are common.

The development of smaller, and more densely constructed, integrated circuits necessitates the use of smaller interconnects and vias. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different resistivity characteristics. The size of interconnects can be halved by switching from aluminum to copper. Therefore, to meet he need for smaller interconnects, the search continues for a way to use metals, such as copper, in a way that promotes clean electrical connections.

It would be advantageous to employ a method of using copper as a low resistivity material in an interconnect or via between conductors on different layers of an integrated circuit.

It would also be advantageous if the formation of copper oxides could be prevented where copper is used in the fabrication of integrated circuits, and especially within integrated circuit via interconnects, where plasma etching, and other etching techniques using oxygen, are common.

It would also be advantageous if copper could be protected from oxidation with an insulator during processes that promote oxidation, with the insulator being easily removable at a later stage of IC processing. It would be advantageous if the copper insulator could be part of, or processed with, the dielectric films normally used to isolate electrically active sections in IC production.

Accordingly, in an integrated circuit, a method has been provided of connecting an electrical conductor to a connection surface of a copper conductor. The method comprises the step of depositing a multilayered dielectric material on the connection surface of the copper conductor, the multilayered dielectric including first and second dielectric layers which are selectively etchable, with the first layer including nitride, the first layer located adjacent the connection surface, and the second layer extending over the first layer. The method also comprises the step of removing a portion of the second layer to form a via for an electrical conductor, the via extending to, but not through, the first layer. The method comprises the step of removing the remaining material in the via, including the first layer, to create a via, common to both the first and second layers, extending to the connection surface, whereby the connection surface is exposed to permit a connection to an electrical conductor through the via.

In a preferred form of the present invention, a method is provided for using an etchant to remove the second dielectric layer. A suitable etchant is an anisotropic plasma etch. The dielectric material of the second layer is selected, preferably, from a group consisting of tetraethyl orthosilicate (TEOS) oxide, silane, boron nitride (BN), and silicon dioxide.

An integrated circuit has also been provided comprising a copper conductor having a connection surface where an electrical connection is made to another conductor. The integrated circuit comprises a multilayered dielectric material deposited on the connection surface of the copper conductor, the multilayered dielectric including first and second dielectric layers having selective etchability, the first dielectric layer including nitride and located adjacent the connection surface, and the second dielectric layer extending over the first layer. The first and second layers have a common aperture therethrough to define a via extending to the connection surface for receiving the other conductor, whereby the nitride of the first layer protects the connection surface from oxidation during the creation of the via.

In a preferred form of the invention, the nitride layer is a thin film in the range of about 100 to 300 Å. The nitride film is selected, preferably, from a group consisting of silicon nitride and boron nitride.

DETAILED DESCRIPTION OF THE PREFERRED EMBODIMENT

Figure 1:
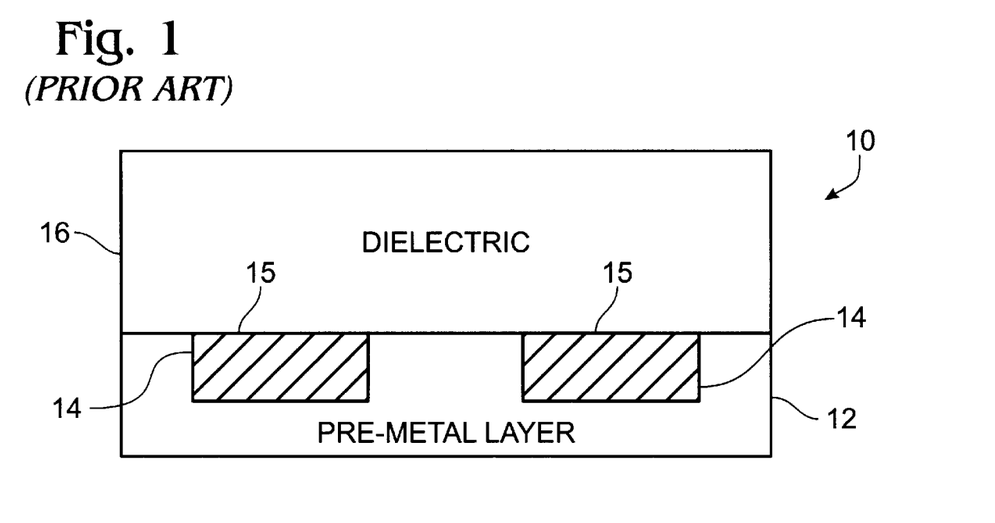
FIG. 1 is a partial cross-sectional schematic view of an integrated circuit substrate including a dielectric layer overlying the connection surface of a conductor (prior art).

The present invention is a system and method of forming a via through a dielectric material to a copper connection surface with the use of a thin film of nitride to protect the copper from oxidation during the removal of the dielectric material. FIGS. 1–4 illustrate a typical prior art method of forming a via through a dielectric material to a connection surface of a conventional (i.e., non-copper) conductor. FIG. 1 is a partial cross-sectional schematic view of an integrated circuit substrate including a dielectric layer overlying the connection surface of a conductor. An integrated circuit 10 includes a pre-metal layer 12. Layer 12 is a section of integrated circuit 10 that has previously completed processing and acts as a foundation for the interconnection layers mentioned below. A pair of conductors 14, such as a metal with low resistivity like aluminum or tungsten, has connection surfaces 15 adjacent to dielectric material 16. For illustrative purposes, two identical and independent conductors 14, each with an independent connection surface 15 are shown in FIG. 1.

Figure 2:
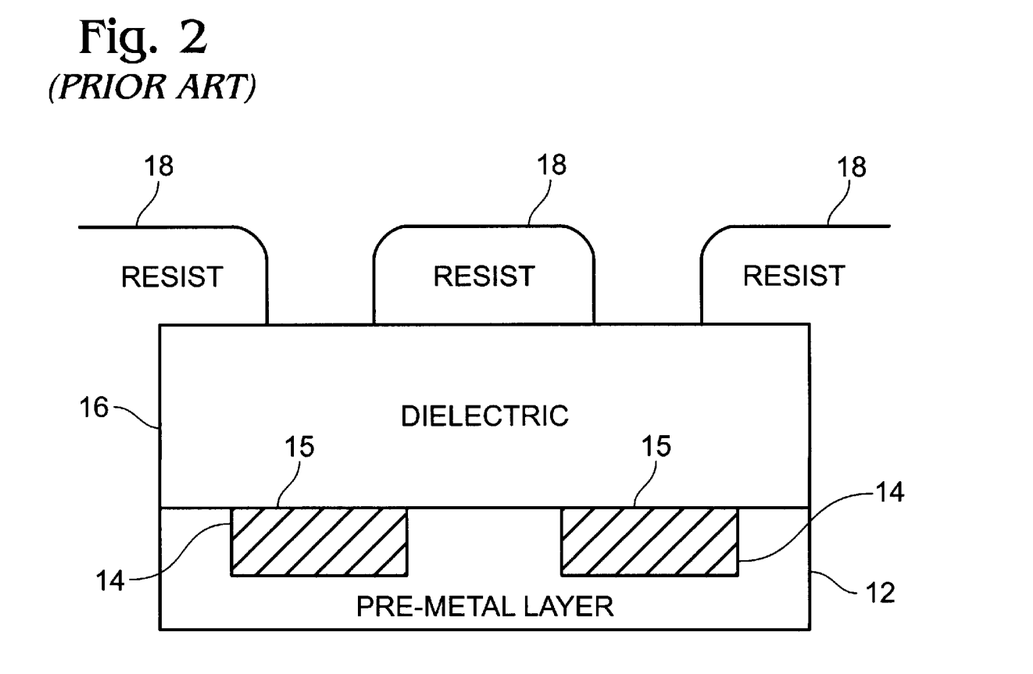
FIG. 2 is a partial cross-sectional view of the integrated circuit of FIG. 1 with a pattern of photoresist overlying the dielectric layer (prior art).

FIG. 2 is a partial cross-sectional view of integrated circuit 10 of FIG. 1 with a pattern of a photoresist 18, a photolithographic material resistant to etch products, overlying dielectric layer 16. Resist 18 is patterned to form openings to dielectric 16 so that an etchant can be used in later steps to form an opening, through dielectric 16, to connection surface 15. Resist 18 is typically a film that is reactive to light. Patterned light exposure causes selected areas of the film resist 18 to form a barrier to certain etching products, as is well known in the art. After resist 18 is deposited, an etchant is applied to IC 10 to remove selected portions of dielectric 16, through the openings in resist 18.

Figure 3:
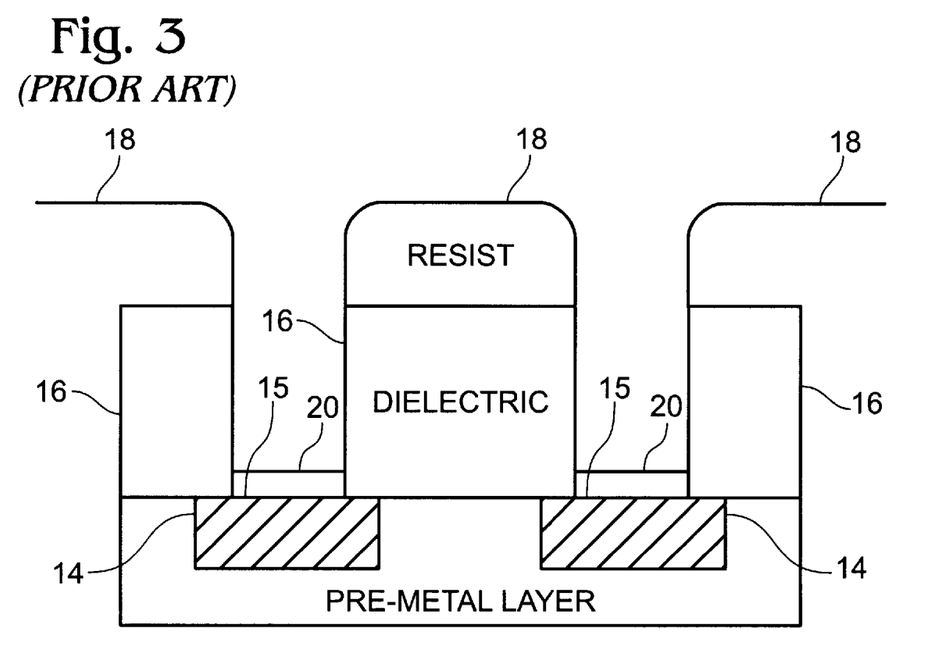
FIG. 3 is a partial cross-sectional view of the integrated circuit of FIG. 1 illustrating the formation of polymers after etching of the dielectric layer (prior art).

FIG. 3 is a partial-cross sectional view of integrated circuit 10 of FIG. 1 illustrating the formation of a polymer 20 after etching of dielectric material 16. Polymer 20 is a generic name to identify parasitic, undesirable, residue that forms after an etchant has been applied to dielectric 16 through the openings provided in the pattern of resist 18. Polymer 20 is typically a by-product of the etchant reacting with resist 18, and to a lesser extent, the etchant reacting with dielectric 16. The formation of polymer 20 prevents a reliable electrical interface from being formed with connection surface 15 of conductor 14.

Figure 4:
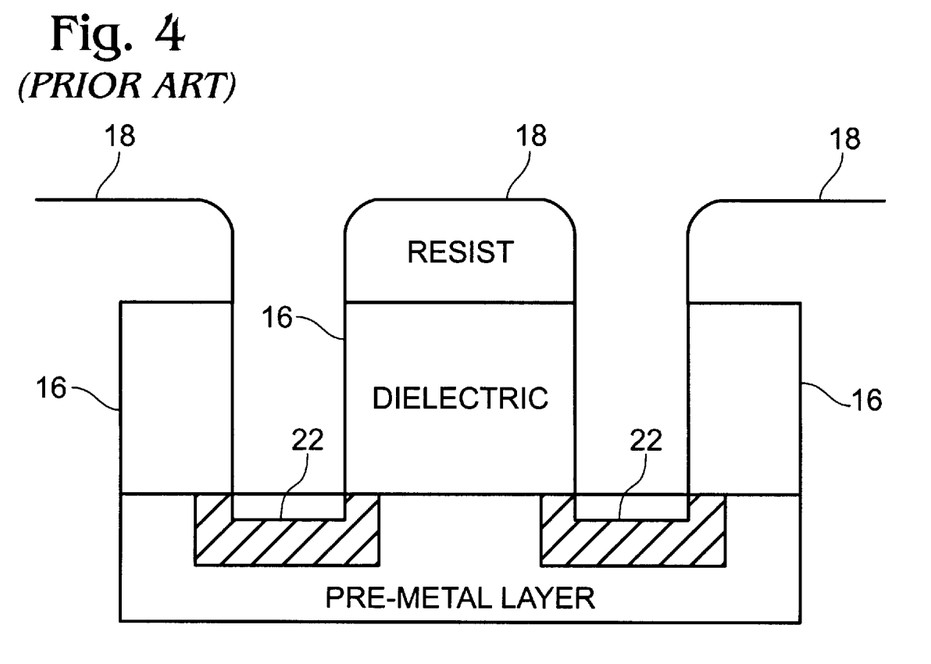
FIG. 4 is a partial cross-sectional view of the integrated circuit of FIG. 1 illustrating the formation of an oxide layer, after etching of the polymer (prior art).

FIG. 4 is a partial cross-sectional view of integrated circuit 10 of FIG. 1 illustrating the formation of an oxide layer 22 after etching of polymer 20. That is, oxide 22 is a product resulting from the use of an etchant, such as a plasma etch containing oxygen, to remove polymer 20 on connection surface 15. To make a reliable electrical connection to connection surface 15, oxide 22 must also be removed. The degree of difficulty in removing oxide 22 is dependent on the material used for conductor 14. Some oxides can be selectively removed without further etching of dielectric 16. Copper oxides are difficult to remove. Acid, used as an etchant, is difficult to control and tends to be isotropic. Further, the acids needed to remove copper oxides are able to fully penetrate narrow openings. Even anisotropic etching techniques, such as sputtering, offer poor selectivity. The top layer of dielectric 16 is often unintentionally removed because of the long periods of time needed to clean a copper oxide from connection surface 15. For this reason, copper is often avoided as a conductor material in IC processing.

Figure 5:
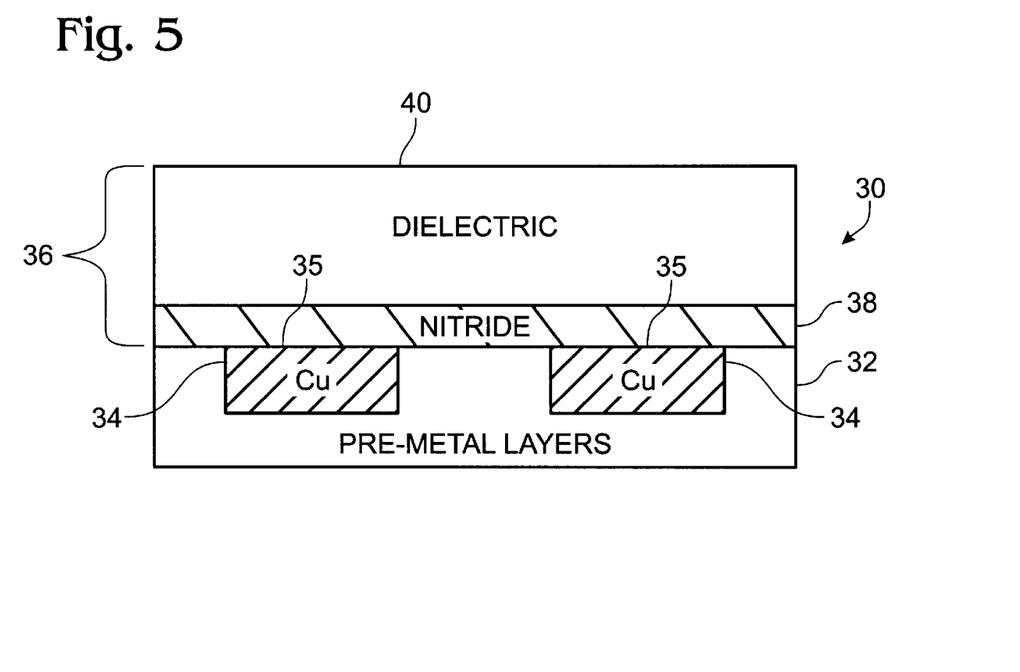
FIG. 5 is a partial cross-sectional schematic view of an integrated circuit substrate of the present invention including a multilayered dielectric material overlying the connection surface of the copper conductor.

FIG. 5 is a cross-sectional schematic view of an integrated circuit substrate of the present invention including a multilayered dielectric material overlying the connection surface of a copper conductor. Integrated circuit 30 comprises a pre-metal layer 32, similar to pre-metal layer 12 in FIG. 1. IC 30 also comprises a pair of copper conductors 34 having connection surfaces 35 where an electrical connection is made to another conductor. For illustrative purposes, FIG. 5 is shown with two identical and independent copper conductors 34, each having an independent connection surface 35. In the following description the singular term will be used in the description of conductors 34 and connection surfaces 35. Integrated circuit 30 also comprises a multilayered dielectric material 36 deposited on, or overlying, connection surface 35 of copper conductor 34, multilayered dielectric 36 includes a first dielectric layer 38 and a second dielectric layer 40 having selective etchability, first dielectric layer 38 including nitride and located adjacent connection surface 35, and second dielectric layer 40 extending over first layer 38. As is well known in the art, multilayered dielectric 36 can be deposited over connection surface 35 in one process step as a two layer film. First layer 38 and second layer 40 can also be deposited as separate process steps. There are also several different techniques for depositing multilayered dielectric 36, as is well known by those skilled in the art.

In a preferred embodiment of the invention, as shown and described with reference to FIGS. 5–10, second layer 40 dielectric layer is selected from a group consisting of TEOS oxide, silane oxide, BN, and silicon dioxide. It is a feature of the preferred embodiment that first layer 38 is a thin nitride film. Nitride film 38, preferably, has a thickness in the range of about 100 to 300 Å. Various types of nitride film 38 are suitable for use with the present invention. In the preferred invention nitride film 38 is selected from a group consisting of silicon nitride and boron nitride (BN). BN is eligible as a dielectric material for use in either first layer 38 or second layer 40. However, the use of BN as the dielectric material for both first layer 38 and second layer 40 is not suggested. The present invention relies upon the etching characteristics of first layer 38 and second layer 40 being different so that the dielectric layers are removed in separate process steps.

Figure 6:
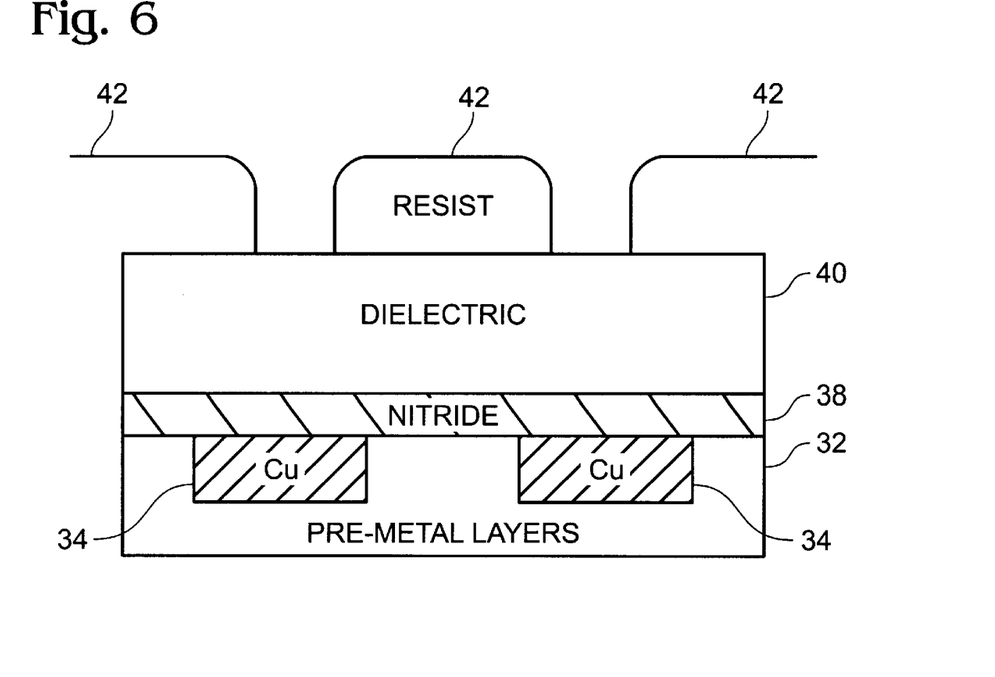
FIG. 6 is a partial cross-sectional view of the integrated circuit of FIG. 5 with a pattern of photoresist overlying the multilayered dielectric material.

FIG. 6 is a partial cross-sectional view of integrated circuit 30 of FIG. 5 with a pattern of a photoresist 42 overlying multilayered dielectric material 36. Photoresist, or resist, 42 is applied in a pattern over dielectric material 36 to provide selective access to dielectric 36 for the purpose of directional etching later in the process. As is well known in the art, and mentioned in the discussion of FIG. 2, there are a variety of resist 42 types, and a variety of methods to apply resist 42. Following the application of resist 42, second layer 40 is etched. Second layer 40 may be etched using either anisotropic or isotropic techniques, but anisotropic etching techniques are preferred when the removal of selected areas of second layer 40 requires directional, precise, control. An etchant selective to second layer 40, but not first layer 38, is used so that first layer 38 is not removed (until later in the process).

Figure 7:
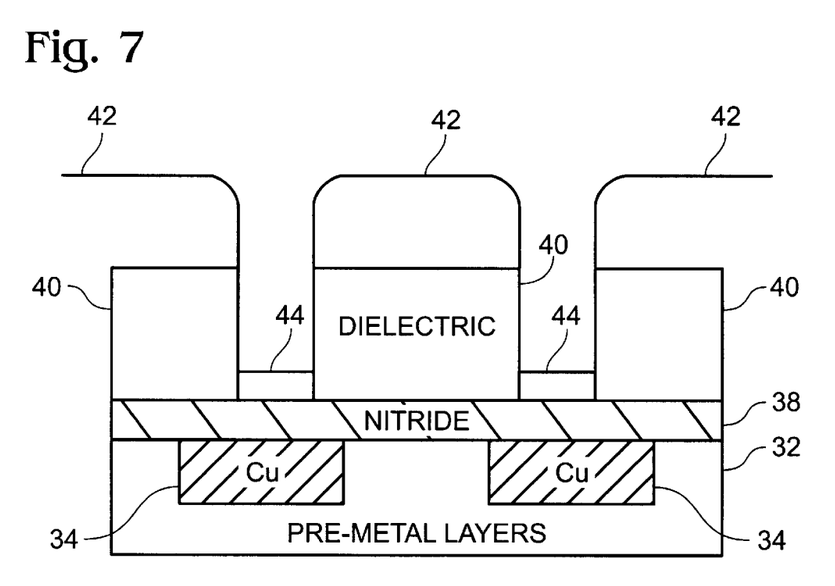
FIG. 7 is a partial cross-sectional view of the integrated circuit of FIG. 5 illustrating the formation of a polymer, after etching the second layer of the dielectric material.

FIG. 7 is a partial cross-sectional view of integrated circuit 30 of FIG. 5 illustrating the formation of a polymer 44 after etching second layer 40 of dielectric material 36. As explained in the description of FIG. 3 above, polymer 44 is typically a parasitic residue of many different by-products resulting from the etching process. Polymer 44 must usually be removed before further etching, of any layers underlying polymer 44, can continue.

Figure 8:
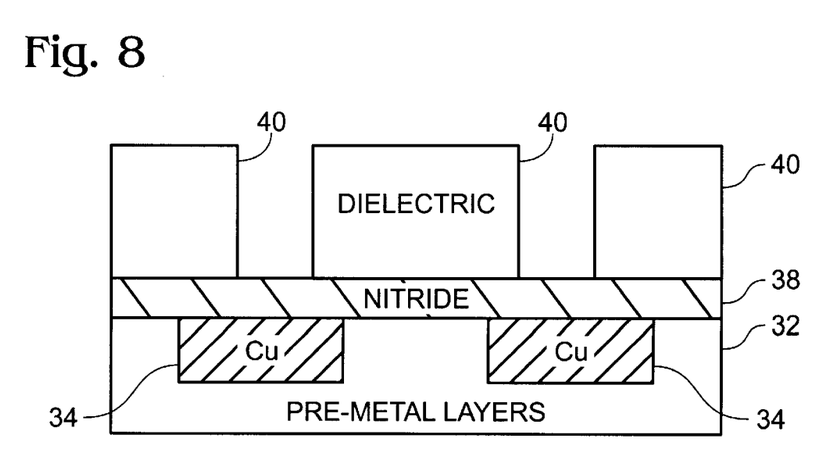
FIG. 8 is a partial cross-sectional view of the integrated circuit of FIG. 5 illustrating the removal of the polymer.

FIG. 8 is a partial cross-sectional view of integrated circuit 30 of FIG. 5 illustrating the removal of polymer 44. An oxygen etch including a plasma ash with $O_2$, or an ozone ash with $O_3$, is typically used to remove polymer 44. These etchants are necessary to clean the difficult to remove polymer 44, although they have to disadvantageous side effect of being conducive to the oxidation of metals.

Figure 9:
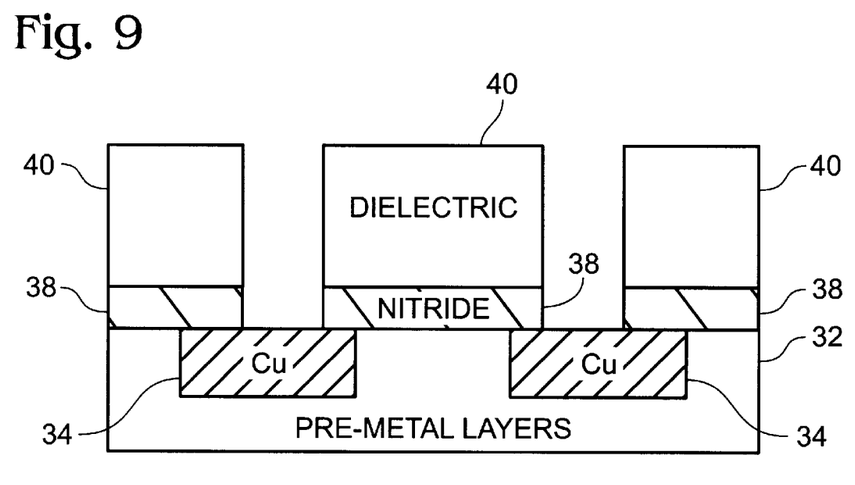
FIG. 9 is a partial cross-sectional view of the integrated circuit of FIG. 5 illustrating the removal of the first layer.

FIG. 9 is a partial cross-sectional view of integrated circuit 30 of FIG. 5 illustrating the removal of first layer 38. Integrated circuit 30 further comprises first layer 38 and second layer 40 layer having a common aperture therethrough to define a via 46 extending to connection surface 35 for receiving another conductor, whereby the nitride of first layer 38 protects connection surface 35 from oxidation during the creation of via 46. That is, via 46 through second layer 40 is formed with first layer 38 protecting connection surface 35 from oxidation. After the removal of polymer 44, another etching process occurs to remove a selected portion of first layer 38. The portion of first layer 38, exposed by the etching of second layer 40, is etched to form a common aperture. The area of the aperture through first layer 38 is approximately equal to the area of the aperture through second layer 40, and the two apertures are in register over connection surface 35 to form via 46.

Figure 10:
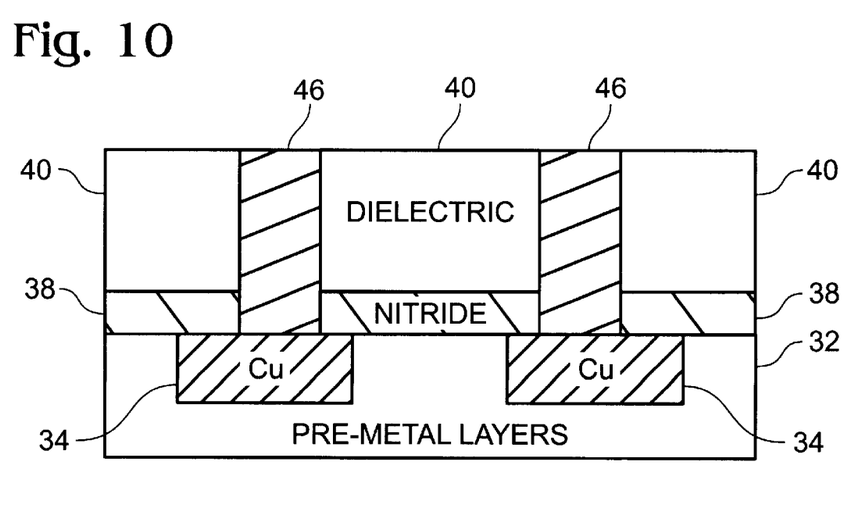
FIG. 10 is a partial cross-sectional view of the integrated circuit of FIG. 5 illustrating the filling of the via with an electrically conductive material to form an electrical interface to the connection surface.

FIG. 10 is a partial cross-sectional view of integrated circuit 30 of FIG. 5 illustrating the filling of via 46 with an electrically conductive material, or conductor, to form an electrical interface to conduction surface 35. In integrated circuit or substrate 30, an electrical connection extending through via 46 comprises a copper conductor 34 having connection surface 35 to which an electrical conductor extending through via 46 is attached, connection surface 35 being substantially free of oxide to form a low resistance electrical interface. That is, via 46, through second layer 40, is formed with first layer 38 protecting connection surface 35 from oxidation. In one preferred embodiment of the invention, via 46 is substantially a cylinder with the height of via 46 substantially equal to the thickness of first layer 38 and second layer 40. Via 46 presents an opening through which an electrical conductor can be inserted to contact connection surface 35. The other end of the conductor is attached to connection surfaces on different layers of the IC from the layer on which connection surface 35 exists. The attachment of the conductor to connection surface 35 is electrically sound since connection surface region 35 is free of oxide.

Figure 11:
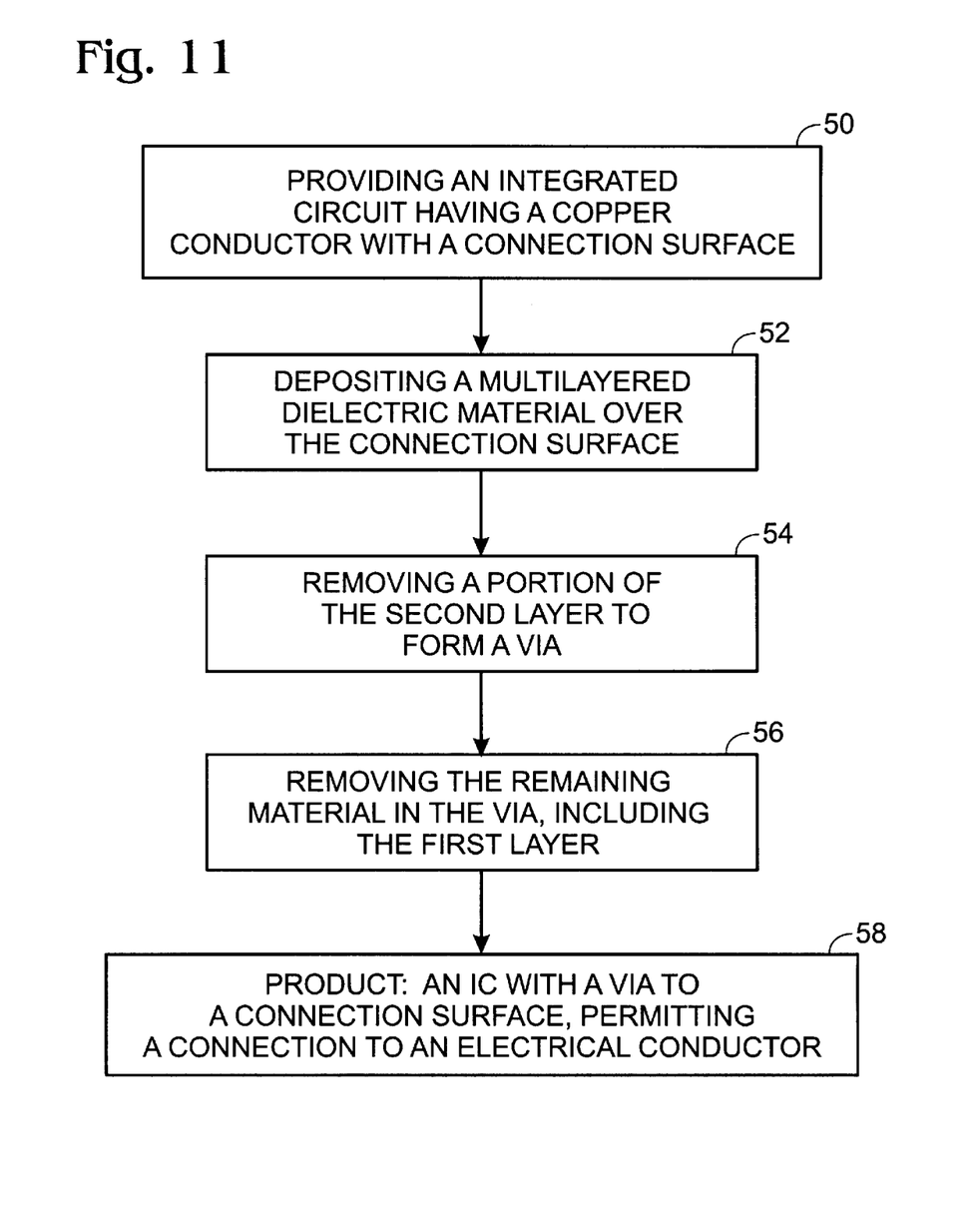
FIG. 11 is a flow diagram illustrating the steps of the method of the present invention.

FIG. 11 is a flow diagram illustrating the steps of the method of the present invention, in an integrated circuit, of connecting an electrical conductor to a connection surface of a copper conductor. Step 50 provides an integrated circuit having a copper conductor with a connection surface. That is, the method is started using a substrate or IC having a copper conductor, with at least one area for a desired connection surface to a different layer of the IC. Step 52 comprises the step of depositing a multilayered dielectric material on the connection surface of the copper conductor, the multilayered dielectric including first and second dielectric layers which are selectively etchable, with the first layer including nitride, the first layer located adjacent the connection surface, and the second layer extending over the first layer. In other words, the connection surface, identified in step 50, is covered with a two layered dielectric material, with the layer adjacent the connection surface being at least partially composed of nitride. As is well known in the art, the multilayered dielectric can be deposited as a single film in one process, or as multiple films in multiple process steps within step 52.

Step 54 removes a portion of the second layer to form a via for an electrical conductor, the via extending to, but not through, the first layer. That is, an etchant is applied to the second layer that is highly selective to the second layer, but not as selective to the first layer. In this manner, the via through the second layer can be made without unintentionally etching through the first layer in the same etching process.

Step 56 removes the remaining material in the via, including the first layer, to create a via, common to both first and second layers, extending to the connection surface, whereby the connection surface is exposed to permit a connection to an electrical conductor through the via.

Step 58 is the formation of an IC product with a via to a connection surface, the via permitting a connection of the connection surface to an electrical conductor. The product of step 58 is of value because the via is formed without oxidizing the connection surface.

In the preferred embodiment of the present invention, step 56 is performed using an etchant selective to the nitride in the first layer to extend the via to the connection surface. The etchant used to remove the first layer is highly selective to nitride, but not as selective to the dielectric material of the second layer. In this manner, the via begun in step 54 is completed in step 56. The etchant of step 56 is used to prevent unintentionally overetching or undercutting of the second layer material surrounding the via as the aperture through the first layer is completed. In one preferred embodiment, the dielectric material of the second layer is selected from the group consisting of TEOS oxide, silane oxide, BN, and silicon dioxide.

It is a feature of the present invention of FIG. 11, that step 52 includes the deposition of a thin film of nitride on the connection surface. Further, it is a feature that the nitride film deposited in step 52 has a thickness in the range of about 100 to 300 Å. The nitride film is preferably selected from a group consisting of silicon nitride and boron nitride. A nitride film of approximately 200 Å is thick enough to prevent the nitride film from being unintentionally etched by the etchant selective to the second layer, but thin enough to be easily removed by a common etchant selective to nitride when the connection surface is to accessed, or opened to a via.

It is suggested that step 54 includes forming an etch resistant pattern on the second layer, the pattern having an opening, and etching the second layer through the opening with an etchant selective to the second layer dielectric to form the portion of the via extending through the second layer. The etch resistant material used in step 54 is preferably a photoresist, or photolithographic film, such as the kind well known in the art.

The etching in step 54 includes the use of an anisotropic plasma etch. Also, a parasitic residue is formed as a result of step 54, and it is suggested that the residue is cleaned with an etchant selective to the residue, prior to step 56. The parasitic residue etchant is typically selected from the group of oxygen ashes consisting of a plasma ash and an ozone ash.

Figure 12:
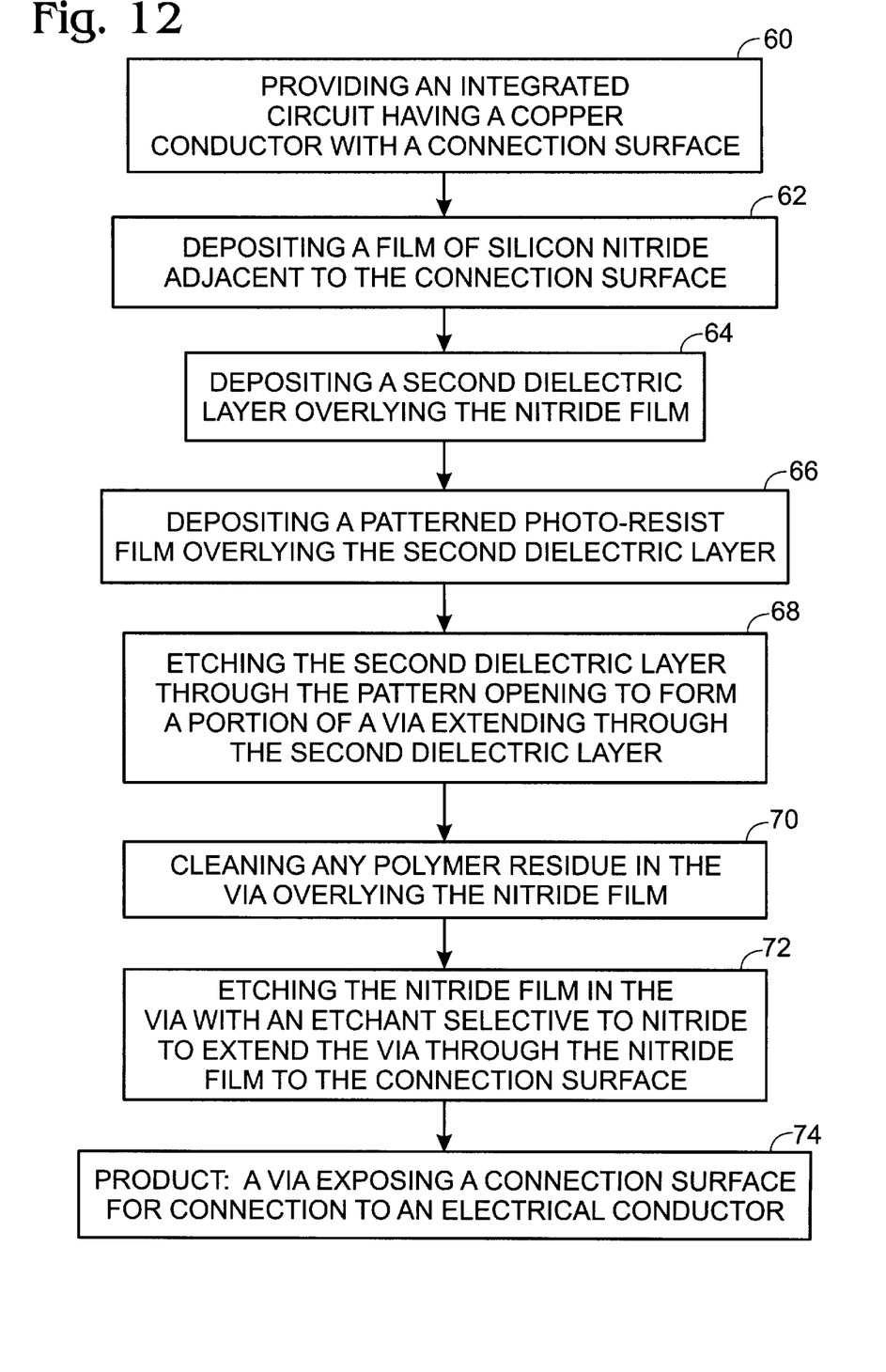
FIG. 12 is an example of the method of the present invention shown in FIG. 11 including additional details.

FIG. 12 is an example of the method of the present invention shown in FIG. 11 including additional details, in an integrated circuit, of connecting an electrical conductor to a connection surface of a copper conductor. The method comprises the step 60 of providing an integrated circuit having a copper conductor with a connection surface. This step is similar to step 50 of FIG. 11, as explained above. The method comprises step 62 of depositing a film of silicon nitride, having a thickness in the range of about 100 to 300 Å, adjacent to the connection surface. The method further comprises step 64 of depositing a second dielectric layer overlying the nitride film deposited in step 62. As mentioned earlier, in explaining FIG. 11, steps 62 and 64 can be combined by using a multilayered dielectric having a first and second layer.

Step 66 is the depositing of a patterned photoresist film overlying the second dielectric layer, the pattern having an opening. Step 68 is the etching of the second dielectric layer through the pattern formed in step 66 with an etchant selective to the second dielectric layer to form a portion of a via extending through the second dielectric layer to, by not through, the nitride film. Such an etchant includes etchants containing $CHF_3$ and CO.

The method illustrated in FIG. 12 further includes step 70 of cleaning any polymer residue deposited as a result of step 68 in the via overlying the nitride film. Step 72 is the etching of the nitride film in the via formed in step 68 with an etchant selective to nitride, extending the via through the nitride film to the connection surface, whereby the connection surface is exposed for connection to an electrical conductor through the via. Step 74 is the completed IC product with a via exposing a connection surface for connection to an electrical conductor.

The preferred embodiment includes the further step, following step 72, of cleaning with a solvent strip, any polymer residue in the via as a result of step 72. Solvent strips include a variety of chemicals used for cleaning in the IC fabrication processes. Also, the etchant selective to nitride used in step 72 may, alternately, include $CHF_3$. In addition to silicon nitride, the film deposited in step 62 is suitably a boron nitride film.

A specific process technique, used to embody the method of the present invention, is presented below. A multilayered dielectric is used having a first layer of silicon nitride. The second layer dielectric material is silicon dioxide, deposited in a method using either TEOS or silane precursors, as is well known in the art. The multilayer film etching process is performed in an Centura 5300 High Density Plasma (HDP) etcher commercially available from Applied Materials. This equipment is designed to etch dielectrics using fluorocarbon based chemistries with process pressures in the milliTorr (mT) range. The plasma is generated by a Radio Frequency (RF) coil that surrounds the upper part of the process chamber; this coil is also referred to the source. A bias potential is generated by applying RF power to an electrode which also serves as the wafer chuck, to secure the wafers during processing.

The three fundamental steps of the process are the dielectric etch, the Post Etch Treatment (PET), and the nitride etch corresponding respectively, to the tasks of removing the second layer of the dielectric material, removing the polymer, and removing the first (nitride) layer of the dielectric material. In addition, there is a bias delay step in between the dielectric etch and the PET, and transition step in between the PET and the nitride etch. The five steps are presented in Table 1, below.

TABLE 1

| Step # | 1 | 2 | 3 | 4 | 5 |
|---|---|---|---|---|---|
| Step name | dielectric etch | bias delay | PET | transition | nitride etch |
| Source (W) | 2800 | 2800 | 2500 | 2000 | 2000 |
| Bias (W) | 800 | 800 | 130 | 150 | 150 |
| Pressure (mT) | 15 | 15 | 15 | 7.5 | 7.5 |
| Time (sec) | 52 | 3 | 45 | 5 | 10 |
| $C_3F_8$ (sccm) | 20 | | | | |
| $CH_3F$ (sccm) | | | | 50 | 50 |
| CO (sccm) | | | | 75 | 75 |
| $O_2$ (sccm) | | 90 | 100 | | |

The dielectric etch step uses approximately 20 standard cubic centimeters (sccm) of either $C_2F_6$ or $C_3F_8$ at 15 mT.

The wafer temperature is in the range of −5 to 10° C. The plasma is generated by 2000 to 3000 watts (W) of 13.56 megahertz (MHz) RF power to the coil, and a bias is generated by 400 to 1000 W RF power to the bottom electrode, again at 13.56 MHz. A typical time for this step is 40 to 60 seconds.

The bias delay step is a transition between the dielectric etch and the PET. The time for this step is on the order of 3 seconds. The RF and bias power levels are the same as in the dielectric etch step. However, the fluorocarbon etchant gas is removed as $O_2$ is introduced into the chamber at a rate of 80 to 100 sccm. The dielectric etch and the bias delay steps presented herein are typical of those used for a standard, prior art, oxide etch.

The PET step continues the $O_2$ flow at near the same level as the bias delay step, but the RF power to the coil and electrode are changed. The coil has a slightly lower power than the previous step, in the range of 1800 to 2800 W. The bottom electrode power is reduced more dramatically to a range of 100 to 200 W. The purpose of the PET step is to remove the polymer residue deposited by the dielectric etch step, and to remove photoresist remaining on the second layer of silicon dioxide. The time for this step is approximately 30 seconds. The wafer temperature during the PET step is approximately −5° C.

In variations of the PET step presented above, the PET time is increased, to as long as approximately 45 seconds, to ash essentially all of the photoresist masking layer remaining. Although the PET step is performed using a plasma etchant including $O_2$, the copper is not oxidized at this step is the process, since the copper is still covered with the nitride layer. Removing the photoresist at this step eliminates the need to use a plasma including $O_2$ to etch the photoresist at a later step in the process, after the nitride layer is removed and the exposed copper is subject to oxidation. Removing the photoresist at this step also protects the copper from oxidation in another way. The photoresist provides a significant source of carbon-containing species that contribute to the polymer deposition on the wafer. Removing the photoresist at this stage minimizes the polymer that will be formed during the (subsequent) nitride etch stage. Preventing the formation of a thick polymer layer to be removed after the nitride etch, when the exposed copper is subject to oxidation, eliminates the need for a plasma etchant including $O_2$ to remove the polymer. A thin layer of polymer is removed with a non-oxide forming cleaner such as a solvent strip.

Following the PET, and before the silicon nitride etch, is the transition step. In the transition step the gases and energy levels are varied, in the space of five seconds, as the chamber is prepared for the nitride etch.

The nitride etch is performed at approximately the same temperature as the previous steps. Approximately 50 sccm of $CH_3F$ and 75 sccm of CO are used at 7.5 mT. In typical prior art processes for the removal of thick layers of nitride, a large amount of polymer is deposited using the nitride etch chemistry and plasma conditions. As a result, relatively long post-etch treatments are required to remove the polymer. In the recipe for the present invention, however, the silicon nitride etch time is very short, approximately 10 seconds, because the thickness of nitride to be etched is small. In etching a 200 Å nitride layer, the resulting polymer is typically only 100 to 200 Å thick, and often non continuous, across the copper connection surface. This thin layer of polymer is removed without the need of a plasma etch that oxidizes the copper, a solvent strip is sufficient for removal of the polymer. To keep the polymer layer thin enough for removal with a solvent, not only must the nitride layer be thin, but it is also important that polymer forming photoresist be removed in the earlier PET step, as mentioned above.

In another variation of the above process, the gas $C_2F_6$ may be used at the same flow, instead of $C_3F_8$, in the dielectric etch step to reduce the polymer deposition. The use of $C_2F_6$ in the process, however, tends to make the etch rate more uncertain. In a further variation of the process, two chambers are used. Steps 1–3 are performed in a first chamber and step 5 is performed in a second chamber (step 4 is eliminated). Two chambers are used to minimize the interaction between the oxide etch and nitride etch processes.

The system and method of the present invention is particularly useful for constructing interconnects and vias to copper connection surfaces. The method of the present invention allows the use of copper with plasma etching, and other etching techniques, which promote the oxidation of copper. Other related uses of nitride layers to protect copper, and other sensitive materials from contamination are suggested by the present invention. Also suggested is the use of a nitride layer to protect the various layers and materials in an IC from other, contaminant, materials by sealing the contaminant material with a layer of nitride. Modifications and variations within the scope of the present invention will occur to those skilled in the art.

What is claimed is:

1. In an integrated circuit, a method of connecting an electrical conductor to a connection surface of a copper conductor, the method comprising the following steps:

a) depositing a multilayered dielectric material on the connection surface of the copper conductor, the multilayered dielectric including first and second dielectric layers which are selectively etchable, with the first layer including nitride and having a thickness in the range of about 100 Å, to less than 300 Å, the first layer located adjacent the connection surface, and the second layer extending over the first layer;

b) removing a portion of the second layer to form a via for an electrical conductor, the via extending to, but not through, the first layer; and c) removing a portion of the first layer, to create a via, common to both the first and second layers, extending to the connection surface, whereby the connection surface is exposed to permit a connection to an electrical conductor through the via.

2. A method as in claim 1 in which step c) is performed using an etchant selective to the nitride in the first layer to extend the via to the connection surface.

3. A method as in claim 1 in which the dielectric material of the second layer is selected from the group consisting of TEOS oxide, silane oxide, BN, and silicon dioxide.

4. A method as in claim 1 in which the nitride film is selected from the group consisting of silicon nitride and boron nitride.

5. A method as in claim 1 in which step b) includes forming an etch resistant pattern on the second layer, the pattern having an opening; and etching the second layer through the opening with an etchant selective to the second layer dielectric to form the portion of the via extending through the second layer.

6. A method as in claim 5 in which the etch resistant material is a photoresist film.

7. A method as in claim 5 in which the step of etching the second layer includes the use of an anisotropic plasma etch.

8. A method as in claim 5 wherein a parasitic residue is formed as a result of step b), and in which the residue is cleaned with an etchant selective to the residue, prior to step c).

9. In an integrated circuit, a method of connecting an electrical conductor to a connection surface of a copper conductor, the method comprising the following steps:

a) depositing a nitride film having a thickness in the range of about 100 Å, to less than 300 Å, adjacent to the connection surface;

b) depositing a second dielectric layer overlying the nitride film deposited in step a);

c) depositing a patterned photoresist film overlying the second dielectric layer, the pattern having a opening;

d) etching the second dielectric layer through the pattern opening formed in step c) with an etchant selective to the second layer to form a portion of a via extending through the second dielectric layer to, but not through, the nitride film;

e) cleaning any polymer residue deposited as a result of step d) in the via overlying the nitride film; and etching the nitride film in the via formed in step d) with an etchant selective to nitride, extending the via through the nitride film to the connection surface, whereby the connection surface is exposed for connection to an electrical conductor through the via.

10. A method as in claim 9 including the further step, following step f), of cleaning with a solvent strip, any polymer residue in the via as a result of step f).

11. A method as in claim 9 in which said second dielectric layer is selected from the group consisting of TEOS oxide, silane oxide, BN, and silicon dioxide.

12. A method as in claim 9 in which the etchant selective to nitride used in step f) includes $CHF_3$.

13. A method as in claim 9 in which the nitride film deposited in step a) is a boron nitride film.

* * * * *